US008948330B1

United States Patent
Dai

(10) Patent No.: US 8,948,330 B1
(45) Date of Patent: Feb. 3, 2015

(54) SYSTEMS AND METHODS FOR PERFORMING VARIABLE STRUCTURE TIMING RECOVERY

(75) Inventor: Shaoan Dai, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 197 days.

(21) Appl. No.: 13/589,460

(22) Filed: Aug. 20, 2012

Related U.S. Application Data

(60) Provisional application No. 61/526,517, filed on Aug. 23, 2011, provisional application No. 61/526,523, filed on Aug. 23, 2011.

(51) Int. Cl.
*H04L 7/00* (2006.01)
(52) U.S. Cl.
USPC ............ 375/371; 375/376; 327/147; 327/156
(58) Field of Classification Search
USPC .......... 375/371, 373, 375, 376, 354; 327/146, 327/147, 150, 155, 156, 159, 162
See application file for complete search history.

(56) References Cited

U.S. PATENT DOCUMENTS

| | | | |
|---|---|---|---|
| 6,597,249 B2 * | 7/2003 | Chien et al. | 331/177 R |
| 2002/0061087 A1 * | 5/2002 | Williams | 375/376 |
| 2005/0052208 A1 * | 3/2005 | Starr | 327/156 |
| 2006/0008042 A1 * | 1/2006 | Cranford et al. | 375/376 |
| 2008/0238505 A1 * | 10/2008 | Chatterjee | 327/157 |

OTHER PUBLICATIONS

"New Packet Processor, Transceiver-based Solutions Allow Network Equipment OEMs to Slash Power Consumption and Reduce Cost while Boosting Performance," Marvell Company News Release, retrieved from http://www.marvell.com/company/news/pressDetail.do?releaseID=1438 on Mar. 20, 2013 (2 pages).

* cited by examiner

*Primary Examiner* — Dac Ha

(57) ABSTRACT

In accordance with an embodiment of the disclosure, systems and methods are provided for aligning signals in a timing recovery system. In certain implementations, a coarse phase error indicative of a phase offset between a reference signal and a signal is identified. The signal is transformed based at least in part on the coarse phase error, and operation of a phase-locked loop is initiated based at least in part on the coarse phase error.

22 Claims, 12 Drawing Sheets

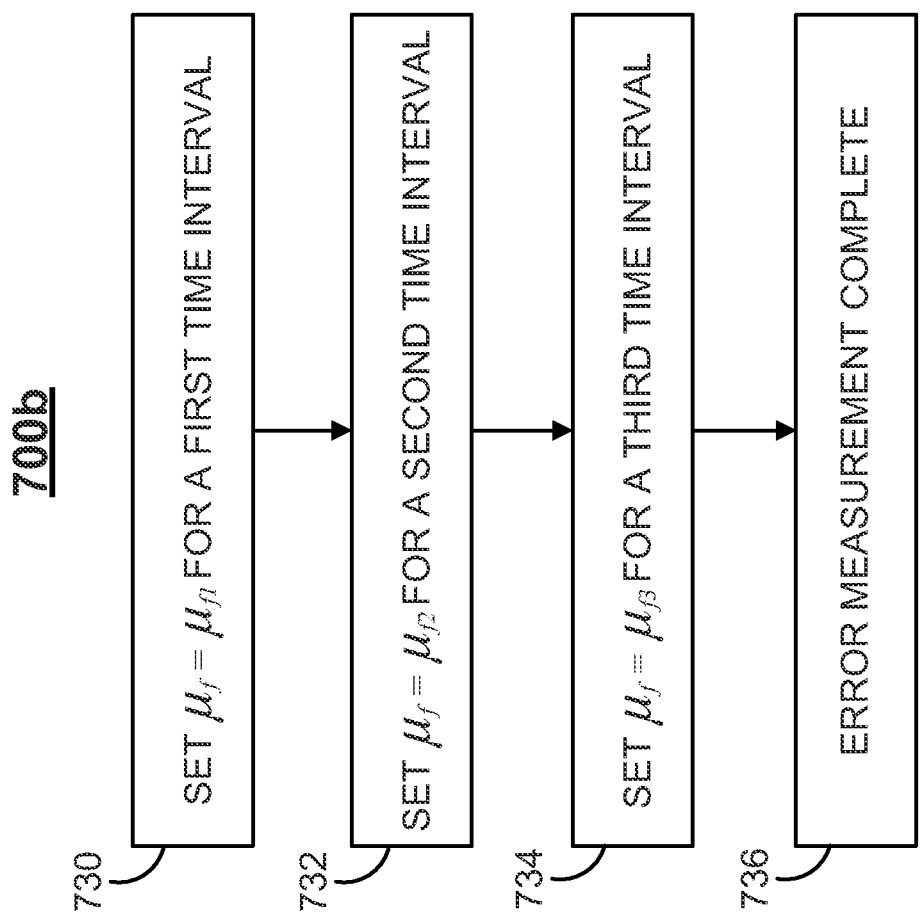

SYSTEMS AND METHODS FOR PERFORMING VARIABLE STRUCTURE TIMING RECOVERY

CROSS REFERENCE TO RELATED APPLICATIONS

This application claims the benefit under 35 U.S.C. §119 (e) of U.S. Provisional Application No. 61/526,517, filed on Aug. 23, 2011, and U.S. Provisional Application No. 61/526,523, filed on Aug. 23, 2011, which are both incorporated herein by reference in their respective entireties.

FIELD OF USE

The present disclosure relates generally to timing recovery systems and methods, and more particularly, to systems and methods for aligning signals in a timing recovery system.

BACKGROUND

The background description provided herein is for the purpose of generally presenting the context of the disclosure. Work of the inventor hereof, to the extent the work is described in this background section, as well as aspects of the description that may not otherwise qualify as prior art at the time of filing, are neither expressly nor impliedly admitted as prior art against the present disclosure. The present disclosure relates generally to aligning signals in a variable structure timing recovery system, and, more particularly, to phase offset estimation for systems using power savings standards such as Energy Efficient Ethernet (EEE).

In a system using EEE, levels of activity (such as amounts of data transmission) are monitored, and amounts of power that are provided to components within the system are adjusted accordingly. For example, when a device such as a computer is not active, a port on a switch corresponding to the computer may be powered down into a standby or a sleep mode, leading to savings in power consumption. The EEE control policy may determine when to enter an energy saving state and how long to remain in an energy saving state. After the sleep mode, the system is in a period of wake training mode. The wake training mode serves to transition the system from sleep mode to normal mode, during which the system transmits data. By the end of the wake training mode, the system needs to be ready to transmit data in a normal data transmission mode. Typically, the standard specifies a maximum amount of time to be spent in the wake training mode, requiring that the system be ready to transmit data in the normal mode within a predetermined amount of time after sleep mode.

During the sleep mode, signals in the system, such as a clock signal, may drift. When a clock signal drifts, the clock signal at the end of the sleep mode may have a frequency and/or phase offset from a reference clock signal. Upon exiting the sleep mode, the system needs to be ready to transmit data in a normal data transmission mode, or to update system parameters in an update mode for EEE. Thus, during a transition between the sleep mode to the normal or update mode (i.e., the wake training mode), it is important to recover the correct and consistent timing across all clock signals in the system such that all components of the system are compatible with one another. In addition, this timing recovery must be performed within a specified time period such as a maximum amount of time allowed to be spent in the wake training mode. One way to ensure the timing recovery is fast is to precisely monitor the frequency and phase offsets attributable to drift during the sleep mode. In this case, upon entry into the wake training mode, the precise estimates of both the frequency and phase offsets are readily available. However, depending on the cost efficiency of the offset monitors, monitoring both the frequency and phase offsets during the sleep mode may consume more power than desired.

SUMMARY

In accordance with an embodiment of the disclosure, systems and methods are provided for aligning signals in a timing recovery system. In certain implementations, a coarse phase error indicative of a phase offset between a reference signal and a signal is identified. The signal is transformed based at least in part on the coarse phase error, and operation of a phase-locked loop is initiated based at least in part on the coarse phase error.

In certain implementations, operation of the phase-locked loop comprises continuously measuring a phase error between the transformed signal and the reference signal, and continuously transforming the signal based at least in part on the measured error.

In certain implementations, identifying the coarse phase error comprises iteratively selecting a candidate phase offset in a plurality of candidate phase offsets. For each selected candidate phase offset, the signal is transformed based at least in part on the selected candidate phase offset, and an error is measured between the transformed signal and the reference signal. The coarse phase error is identified as a candidate phase offset with an error below a predetermined threshold. In certain implementations, measuring the error comprises obtaining a phase difference signal between the transformed signal and the reference signal. In certain implementations, measuring the error further comprises applying a low pass filter to the phase difference signal. A gain parameter of the low pass filter is initially set to a first value, followed by a second value less than the first value.

In certain implementations, transforming the signal comprises shifting the signal by an amount corresponding to the coarse phase error.

In certain implementations, continuously transforming the signal comprises shifting the signal by an amount corresponding the continuously measured phase error.

In certain implementations, operation of the phase-locked loop comprises activating a first-order path comprising an integrator and determining first-order operation is complete when the continuously measured phase error is less than a first pre-determined threshold. In certain implementations, operating the phase-locked loop further comprises activating a second-order path comprising two integrators when determining that first-order operation is complete. Second-order operation is determined to be complete when the continuously measured phase error is less than a second pre-determined threshold, wherein the second pre-determined threshold is less than the first pre-determined threshold.

In certain implementations, operating the phase-locked loop comprises activating a first-order path comprising an integrator and determining first-order operation is complete when a pre-determined time threshold is reached.

BRIEF DESCRIPTION OF THE DRAWINGS

The above and other features of the present disclosure, including its nature and its various advantages, will be more apparent upon consideration of the following detailed description, taken in conjunction with the accompanying drawings in which:

FIG. 7B shows a flow diagram of a method for measuring an error noise, in accordance with an embodiment of the disclosure;

DETAILED DESCRIPTION

To provide an overall understanding of the disclosure, certain illustrative embodiments will now be described, including a circuit for identifying an optimum phase offset between two or more signals. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope thereof.

Figure 1:
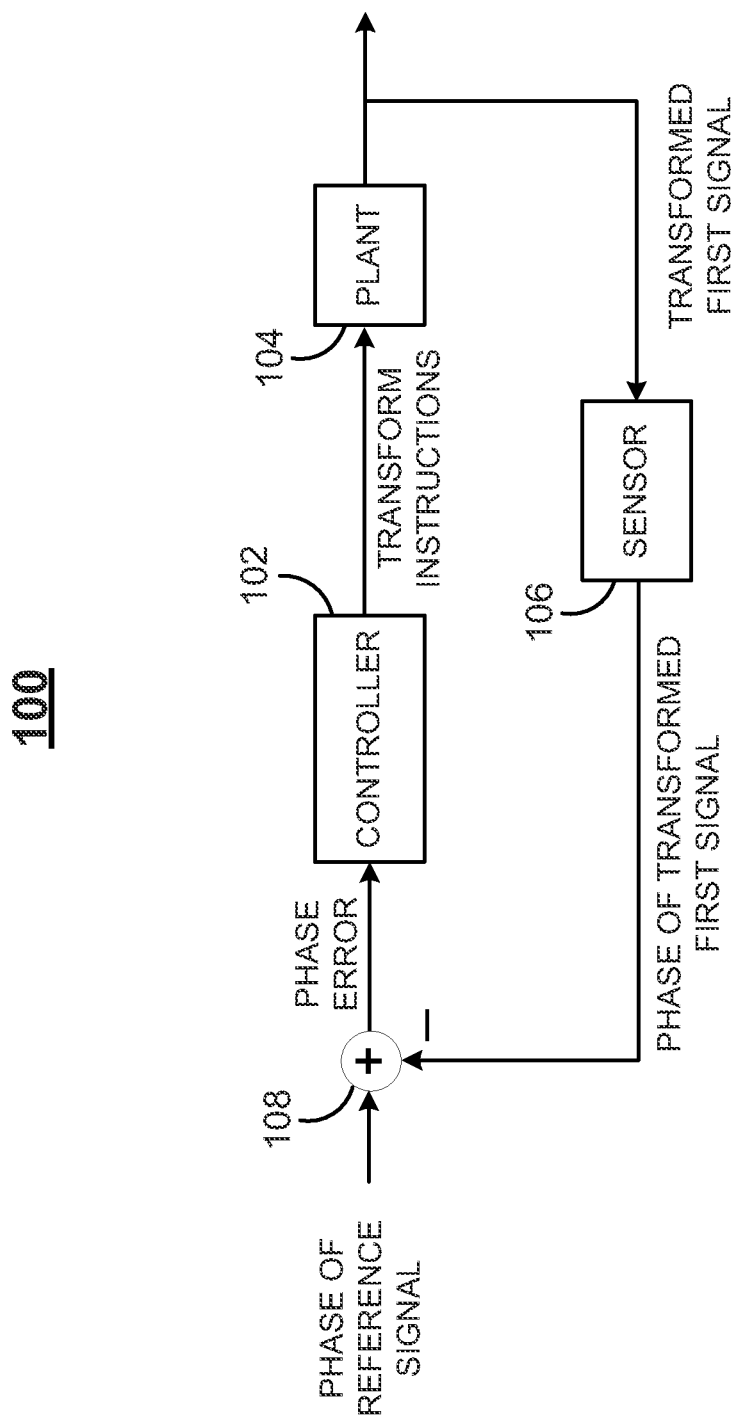
FIG. 1 shows an illustrative block diagram of a control system, in accordance with an embodiment of the disclosure.

FIG. 1 shows a simplified diagram of an illustrative control system 100, in accordance with an embodiment of the disclosure. System 100 includes a controller 102, a plant 104, and a sensor 106. System 100 may be used in accordance with an EEE standard. That is, in order to allow for less power consumption during time intervals of low activity, system 100 may operate in a sleep mode. During the sleep mode, signals in a system, such as clock signals, may drift. A drifted clock signal has a frequency and/or phase offset from a reference clock signal. A wake training mode may be used to transition system 100 from the sleep mode to a normal mode, and system 100 is configured to efficiently align clock signals within a specified amount of time while in the wake training mode.

To align two clock signals, one clock signal may be used as a reference signal, and the other clock signal may be referred to as the first clock signal. The first clock signal is transformed (i.e., by applying a frequency and/or phase offset) to derive a transformed first clock signal that matches the reference signal as close as possible. If there is a large initial error between a transformed first signal and the reference signal, the timing recovery may be slow and may exceed the specified amount of time to be spent in the wake training mode. Therefore, in order to align two clock signals efficiently, an initial frequency and/or phase offset position must be carefully selected.

In an example, a master device and a slave device are part of a system, and each device has a clock signal. Each of the master and slave devices includes a receiver and a transmitter, such that the master's transmitter transmits signals to the slave's receiver, and the slave's transmitter transmits signals to the master's transmitter. In general, the transmitter's clock signal aligns with the receiver's clock signal in the same device. As an example, in the 1000Base-T standard (which is a standard for gigabit Ethernet over copper wiring), the master transmitter clock is the same signal as the system's reference clock. In this case, the slave's receiver's clock (and subsequently the slave's transmitter clock and the master's receiver clock) would also align to the master's transmitter clock. In general, both master and slave devices attempt to align their clock signals to their respective transmitter clock signal, regardless of which device wakes up first. In another example, in the 100Base-T standard, the transmitter clock is the same as the system's clock, such that the receiver clock aligns with the local transmitter clock. In general, the systems and methods described herein are applicable to any configuration of one or more devices in a system that aligns multiple signals.

In system 100, plant 104 receives transform instructions from controller 102 to perform on a first signal (i.e., the clock signal to be aligned to a reference signal). Plant 105 may include a memory device for storing the first clock signal, and may further include a processor for executing the transform instructions on the first clock signal. In particular, the transform instructions include a frequency offset (i.e., provided by the high precision frequency estimator) and a phase offset. To apply the frequency offset, plant 104 scales a horizontal coordinate (i.e., in time) of the first clock signal by the frequency offset value, thereby adjusting the frequency of the first clock signal. To apply the phase offset, plant 104 horizontally shifts the first clock signal (i.e., in time) by the phase offset value. Either the frequency offset may be applied before the phase offset, or vice versa. To execute the transform instructions, plant 104 applies the frequency and/or phase offset to the first signal. Plant 104 then outputs a transformed first signal.

Sensor 106 processes the transformed first signal and outputs a phase of the transformed first signal. This phase is subtracted from a phase of a reference signal at adder 108, and the difference is provided to controller 102. Based on the phase difference, controller 102 generates new transform instructions to attempt to reduce the phase difference. In an example, the transform instructions include applying a phase offset to the first signal. The remainder of this disclosure relates to a variable structure circuitry that may be used within controller 102 for efficiently aligning a reference signal and a first signal during the wake training mode.

Most of this disclosure relates to aligning clock signals. A clock signal may be any periodic signal, such as a sinusoidal wave, a square wave. However, it will be understood to one of ordinary skill in the art that the systems and methods described herein may be used to align any type of signal, including aperiodic signals or data signals embedded with timing information.

Figure 2:
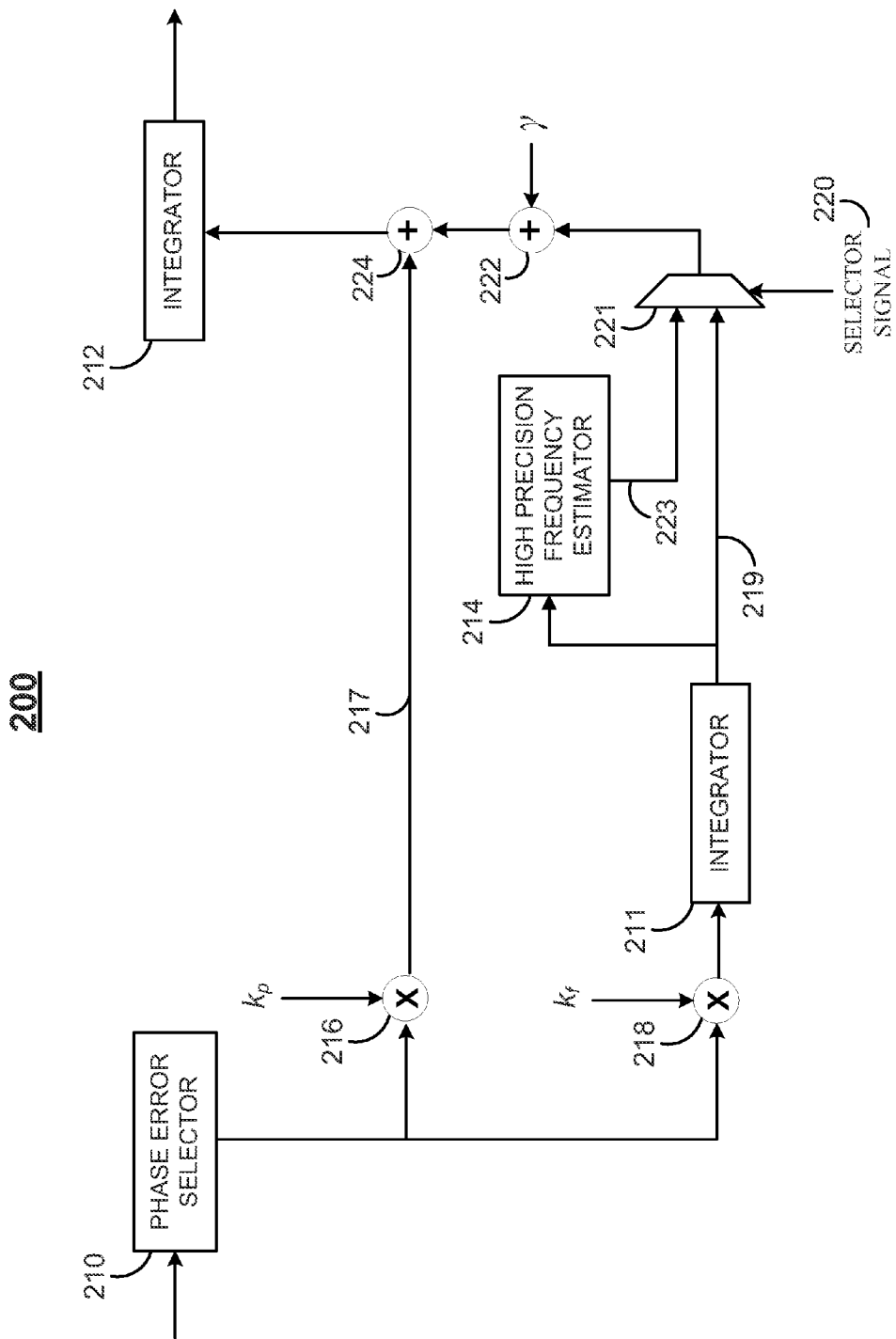
FIG. 2 shows an illustrative block diagram of a variable structure timing recovery system, in accordance with an embodiment of the disclosure.

FIG. 2 shows a simplified diagram of an illustrative timing recovery system 200, in accordance with an embodiment of the disclosure. System 200 may be used as the controller 102 in a control system 100. In particular, the output of system 200 may be a phase offset provided to a block such as plant 104.

Plant 104 may apply the received phase offset to a first signal, obtaining a transformed first signal. A difference between the phases of the transformed first signal and a reference signal may then be provided to controller 102, or system 200. System 200 may accordingly make adjustments in an attempt to derive a phase offset that gives rise to minimal error values.

System 200 is configured to operate in three sequential modes: an optimal phase search mode, followed by a first order phase locked loop mode, followed by a second order phase locked loop mode. The optimal phase search mode results in a coarse estimate of an optimal phase offset. Once the coarse estimate is identified, the first order phase locked loop mode may be used to further apply phase adjustments, which may result in a smaller overall error than provided by the coarse estimate of the phase offset. Finally, the second order phase locked loop mode may be used to apply even further phase adjustments, which may results in an even smaller overall error than provided by the first order phase locked loop mode. Thus, each sequential mode gives a reduced error between a transformed version of the first signal and the reference signal. Using these three sequential modes with increasing degrees of precision allows for system 200 to efficiently and precisely align the two signals. Each mode is described in detail below and in reference to FIG. 4. Operation in different modes may be configured by selecting different values for control parameters $k_p$, $k_f$, $\gamma$, and a selector signal 220.

While three sequential modes are described herein, one of ordinary skill in the art will understand that any combination of any number of modes may be used. For example, if a first estimate of the optimal phase offset (with a coarse resolution) has already been identified, system 200 may bypass the optimal phase search mode and operate in the first order phase locked loop mode followed by the second order phase locked loop mode. In addition, any number of any order phase locked loops may be used, including third order, fourth order, fifth order phase locked loops, and so on. The order of a phase locked loop may be selected based on some criteria. For example, if it is desirable to reach alignment between the two signals very quickly (i.e., only a small amount of time is allowed in the wake training mode), and if it is known that the optimal phase offset is within a small range of values, higher order phase locked loops may be used.

System 200 includes a phase error selector 210, integrators 211 and 212, and a high precision frequency estimator 214. High precision frequency estimator 214 receives as input the output of integrator 211, and is in operation when $k_f$ is set to some non-zero value. In addition, high precision frequency estimator 214 may include an accumulator or an integrator and behaves as a low pass filter to smooth high frequency noise in the input signal.

During sleep mode, $k_p$ and $k_f$ are both set to zero, and the output 223 of the high precision frequency estimator 214 is held fixed and is selected by the selector signal 220 at the multiplexer 221. The output 223 of the high precision frequency estimator 214 is in units of frequency offset scaled by time. In particular, because a frequency value is the time derivative of the phase offset (i.e., frequency may be thought of as a phase offset per cycle), the output of the integrator 212 is a high precision phase offset.

Figure 3A:
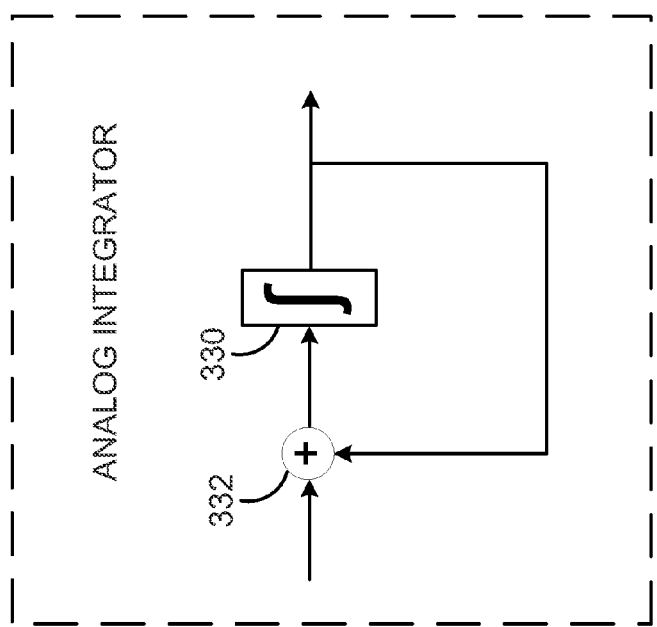
FIGS. 3A and 3B show illustrative block diagrams of an integrator, in accordance with an embodiment of the disclosure.
Figure 3B:
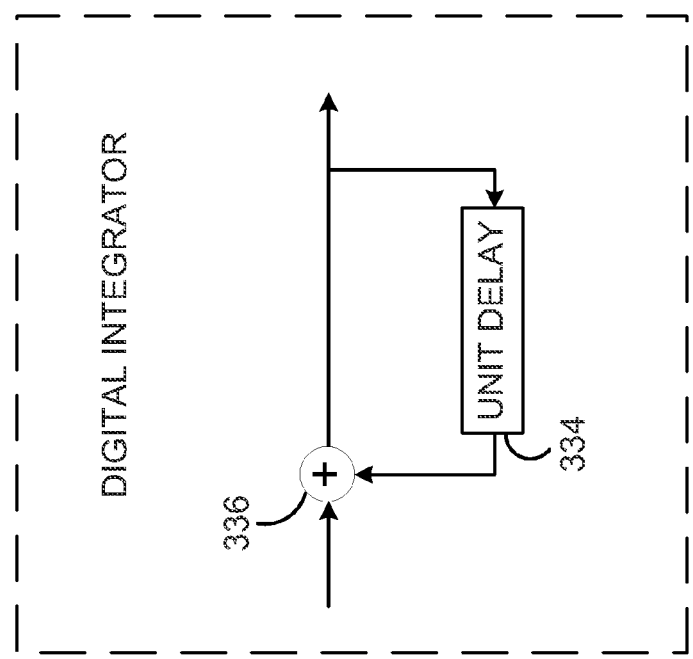
Figure 3C:
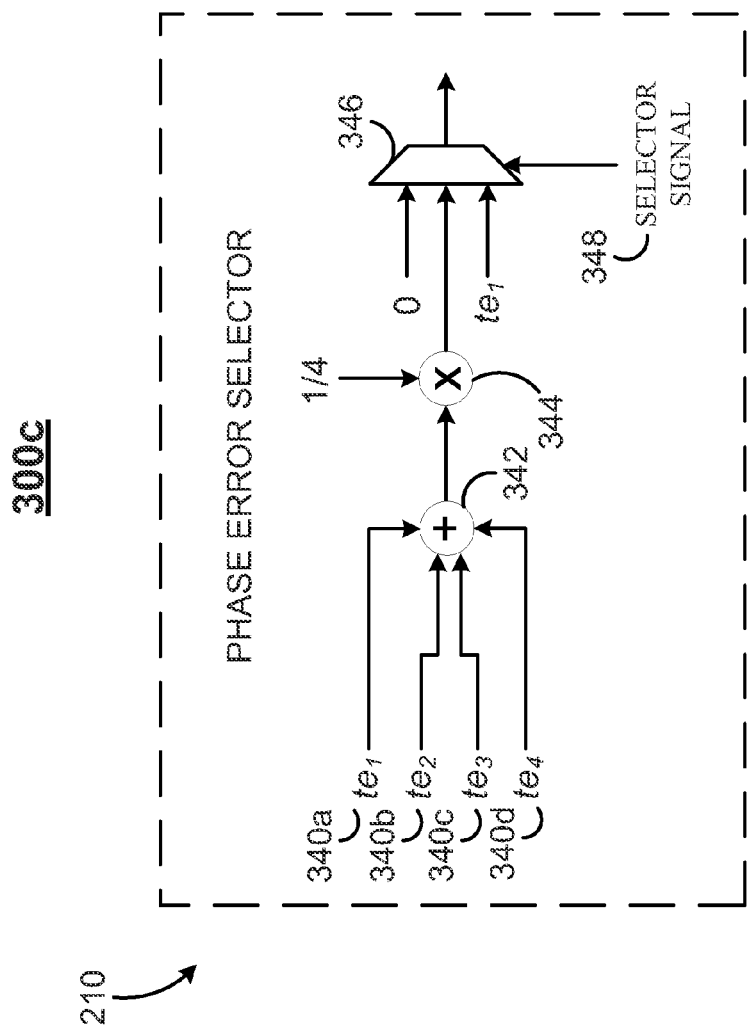
FIG. 3C shows an illustrative block diagram of a phase error selector, in accordance with an embodiment of the disclosure.

Phase error selector 210 selects an error associated with the timing between two clock signals and is described in more detail in relation to FIG. 3C. In particular, phase error selector 210 may select a common mode timing error. In an example, the common mode timing error may be computed by averaging a number of timing errors arising from different channels. The common mode timing error may be selected during the wake training mode. For example, the various timing errors arising from different channels may be noisy. In this case, averaging the timing errors across channels may reduce this noise, possibly giving rise to a more efficient and precise alignment across multiple signals. Alternatively, during the normal mode, phase error selector 210 may select a single timing error arising from one channel.

Gain and bandwidth parameters $k_p$ and $k_f$ represent bandwidth and gain control of a first order path and a second order path, respectively. The first and second order paths include first and second order low pass filters, respectively.

Filters with gain and bandwidth controlled by parameters $k_p$ and $k_f$ include integrators 211 and 212. Integrators 211 and 212 are phase accumulators and may include the same components or different components. In particular, integrator 211 and/or 212 may be an analog integrator (as shown in FIG. 3A), a digital integrator (as shown in FIG. 3B), or any other suitable component in a low pass filter. Integrators 211 and 212 provide smoothed versions of their inputs, and it will be understood to one of ordinary skill in the art that any suitable smoothing function may also be used.

During the optimal phase search mode, system 200 operates as an open loop circuit. In particular, parameters $k_p$ and $k_f$ are both set to zero, and a set of candidate phase offset values for $\gamma$ is parsed to identify an optimal phase in the set of phase values. The parameter $\gamma$ represents a phase offset to add (at adder 222) to the output of high precision frequency estimator 214. The coarse estimate of the optimal phase offset in the set of phase offsets corresponds to the phase offset that results in minimal error between the reference signal and the transformed first signal, or a phase offset that results in an error below a predetermined threshold. Operation in optimal phase search mode is described in more detail in relation to FIGS. 6-8.

After a coarse estimate of the optimal phase has been identified using the optimal phase search mode, system 200 transitions to a closed loop mode. In particular, the identified coarse estimate for $\gamma$ is applied once to the adder 222 (i.e., for one clock cycle or one sample cycle). After applying the coarse estimate for $\gamma$ for a single cycle, system 200 transitions to operation in a first order phase locked loop mode. In particular, in the first order mode, $\gamma$ is set to zero because the coarse estimate of the optimal phase has already been applied at the end of the optimal phase search mode in integrator 212, when the coarse estimate is stored in integrator 212. In addition, parameter $k_p$ is set to some non-zero value. In the first order mode, parameter $k_p$ is a gain and bandwidth parameter for a first order low pass filter including integrator 212. An appropriate choice for the value of parameter $k_p$ may be selected to ensure that the system 200 is stable. The first order low pass filter smooths the phase error, mitigating the noise arising from phase and frequency drift and the measurement process. In addition, parameter $k_f$ is still set to zero in the first order mode, and the selector signal 220 for multiplexer 223 selects the input 223. Operation in the first order phase locked loop mode regulates and stabilizes system 200 by slowing down changes and/or oscillations in the measured error with time. Operation in the first order mode is complete when the phase error (i.e., input to phase error selector 210) is sufficiently small. Alternatively, a timer may be set, such that operation in the first order mode is complete when the timer expires.

When the first order phase locked loop mode is complete, system 200 transitions to operation in a second order phase locked loop mode. The second order mode serves to obtain an even smaller phase error, and is able to converge quickly to a precise phase offset. In particular, as in the first order mode, $\gamma$ is still fixed to zero. In the second order phase locked loop mode, both $k_p$ and $k_f$ are set to non-zero values and are parameters of system 200 that determine the system's gain, bandwidth, and damping factors. In addition, selector signal 220 selects output signal 219 at multiplexer 221. The second order mode includes activation of the first order path including multipler 216 and integrator 212 and additionally includes activation of a second order path including multiplier 218 and integrators 211 and 212. Parameter $k_f$ is a gain and bandwidth parameter for a second order low pass filter, which includes the two integrators 211 and 212. As in the first order mode, the second order mode smoothes the phase error, mitigating the noise arising from phase and frequency drift and the measurement process. In addition, operation in the second order mode results in fast and precise phase offset compensation. Appropriate values are used for parameters $k_p$ and $k_f$, such that system 200 is stable.

Using a single system with variable structure configured to operate in multiple modes is efficient in terms of both cost and space. In addition, system 200 can be easily inserted as controller 102 in control system 100, and adjusting various output parameters to system 200 allows for operation in multiple modes using the same system.

The methods and systems described herein provide ways for quickly aligning clock signals in a wake training mode, in accordance with an EEE standard, for example. In particular, the frequency offset of a signal (corresponding to a frequency drift of the signal) is precisely monitored even during sleep mode, such that upon entry into a wake training mode from the sleep mode, a precise frequency offset estimate is available for transforming the first signal as a first step to align the first signal to the reference signal. In addition, by using three modes with varying degrees of precision in sequence, system 200 efficiently arrives at a precise alignment across multiple signals.

FIGS. 3A and 3B show illustrative block diagrams of integrators 211 or 212, constructed in accordance with an illustrative embodiment of the disclosure. Both integrators 300a and 300b are infinite impulse response filters, but it will be understood to one of ordinary skill in the art that any low pass filter may be used for integrators 211 or 212, including finite impulse response filters.

Referring now to FIG. 3A, an analog integrator 300a includes an integration block 330 and an adder 332. When the input to analog integrator 300a is a phase term, integrator 300a performs phase accumulation, or integration of the phase input.

Referring now to FIG. 3B, a digital integrator 300b includes a unit delay block 334 and an adder 336. When the input to digital integrator 300b is a phase term, integrator 300b performs phase accumulation, or integration of the phase input.

FIG. 3C shows an illustrative block diagram of a phase error selector 210, constructed in accordance with an embodiment of the disclosure. Phase error selector 210 includes an adder 342, a multiplier 344, and a multiplexer 346. A selector signal 348 selects one of the three outputs to the multiplexer 346. In particular, selector signal 348 may select a zero signal during operation in the optimum phase search mode, as described in relation to FIG. 2. Selecting the zero signal would be redundant because during the optimum phase search, parameter $k_p$ and $k_f$ are also set to zero.

During the wake training mode, selector signal 348 may select a common mode timing error, which is the output of multiplier 344. The common mode timing error corresponds to an average of a number of timing errors 340a-340d (corresponding to $te_1$-$te_4$, respectively), measured from four different channel phase errors. In particular, four different channels may each be tracking the same clock signal. In this case, even when the different channels have different phase positions, they may have the same phase offset. However, independent (or somewhat independent) noise sources corrupt each channel, such that different channels have different noises. The noise may arise from clock signal drift during sleep mode, or may arise from the actual error measurement. Therefore, averaging the timing errors from all the channels may result in a better estimate of the phase error. One of ordinary skill in the art will understand that in general, any number of channels may be used. In particular, in some configurations (in the 100 Base-T standard, which is a Fast Ethernet standard, for example) there is only one channel, such that the individual channel timing error is the same as the common mode timing error.

During the normal data transmission mode, selector signal 348 may select a timing error from a single channel (i.e., $te_1$). Upon entry into the normal mode, the timing recovery is complete, and the first clock signal should be sufficiently in synchrony with the reference clock signal. In the normal mode, the system monitors the timing error $te_1$ in real time using a closed loop circuit (i.e., first order or second order, as shown in FIG. 2). Any adjustments necessary to correct for any frequency or phase drift are made nearly immediately upon detection of a significant timing error $te_1$.

Figure 4:
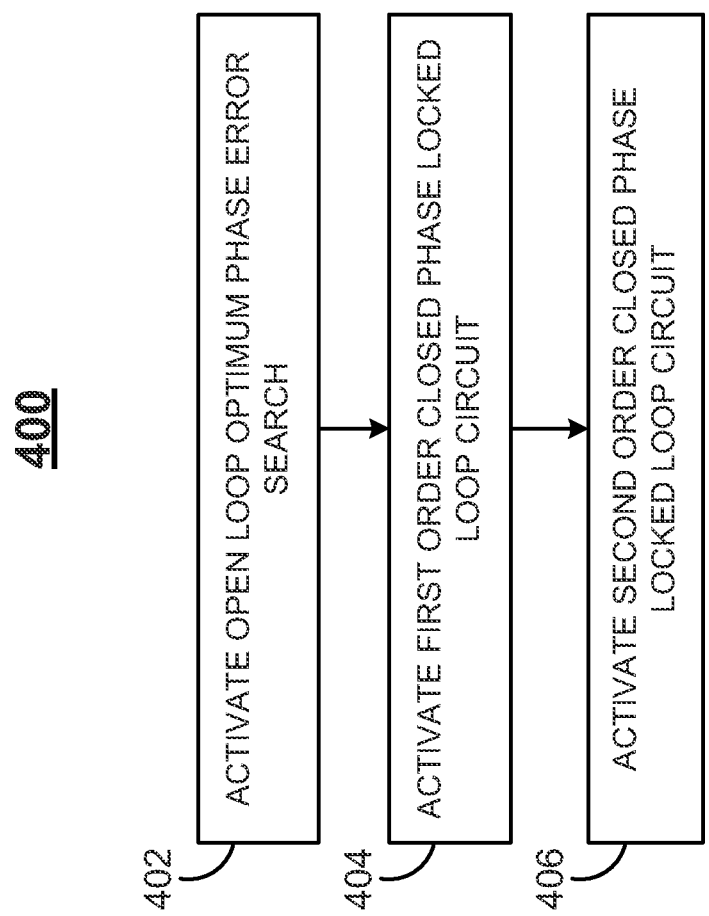
FIG. 4 shows a flow diagram of a method for identifying an optimum phase, in accordance with an embodiment of the disclosure.

FIG. 4 shows a flow diagram of a method for identifying an optimum phase, in accordance with an embodiment of the disclosure. Method 400 includes activating an open loop optimum phase error search (402), activating a first order closed phase locked loop circuit (404), and activating a second order closed phase locked loop circuit (406).

At 402, an open loop optimum phase error search is activated to identify a coarse estimate of the optimal phase offset. In particular, parameters $k_p$ and $k_f$ are both set to zero, and a set of phase offset values for γ is parsed to identify the coarse estimate in the set of phase values. Each phase offset in the set of phase offsets is used to iteratively transform a first signal. For each transformed first signal, an error is measured between the transformed first signal and a reference signal. The phase offset associated with a minimal error or with an error below a predetermined threshold may be identified as the coarse estimate. The open loop optimum phase error search is described in more detail in relation to FIGS. 6-8.

At 404, a first order closed phase locked loop is activated. In particular, because of the limited phase resolution at 402, the first order closed phase locked loop is able to further reduce the phase error. The parameter γ is fixed to zero because the coarse estimate identified during the optimal phase search at 402 has already been applied to the accumulator 212 by the end of step 402. To activate the first order closed phase locked loop, gain and bandwidth parameter $k_p$ is set to some non-zero value. In some embodiments, parameter $k_p$ is fixed while system 200 is in the first order mode. In other embodiments, parameter $k_p$ is allowed to vary while system 200 is in the first order mode. The first order closed phase locked loop is active until some threshold phase error has been reached, or until a timer has expired.

At 406, a second order closed phase locked loop is activated to reduce the phase error even further. In particular, as in the first order closed phase locked loop, the parameter γ is still fixed to zero. To activate the second order closed phase locked loop, parameters $k_p$ and $k_f$ are both set to non-zero values. In some embodiments, parameters $k_p$ and $k_f$ are fixed while system 200 is in the second order mode. In other embodiments, parameters $k_p$ and/or $k_f$ are allowed to vary while system 200 is in the second order mode. The second order closed phase locked loop is active until some threshold phase error has been reached, or until a timer has expired.

Figure 5:
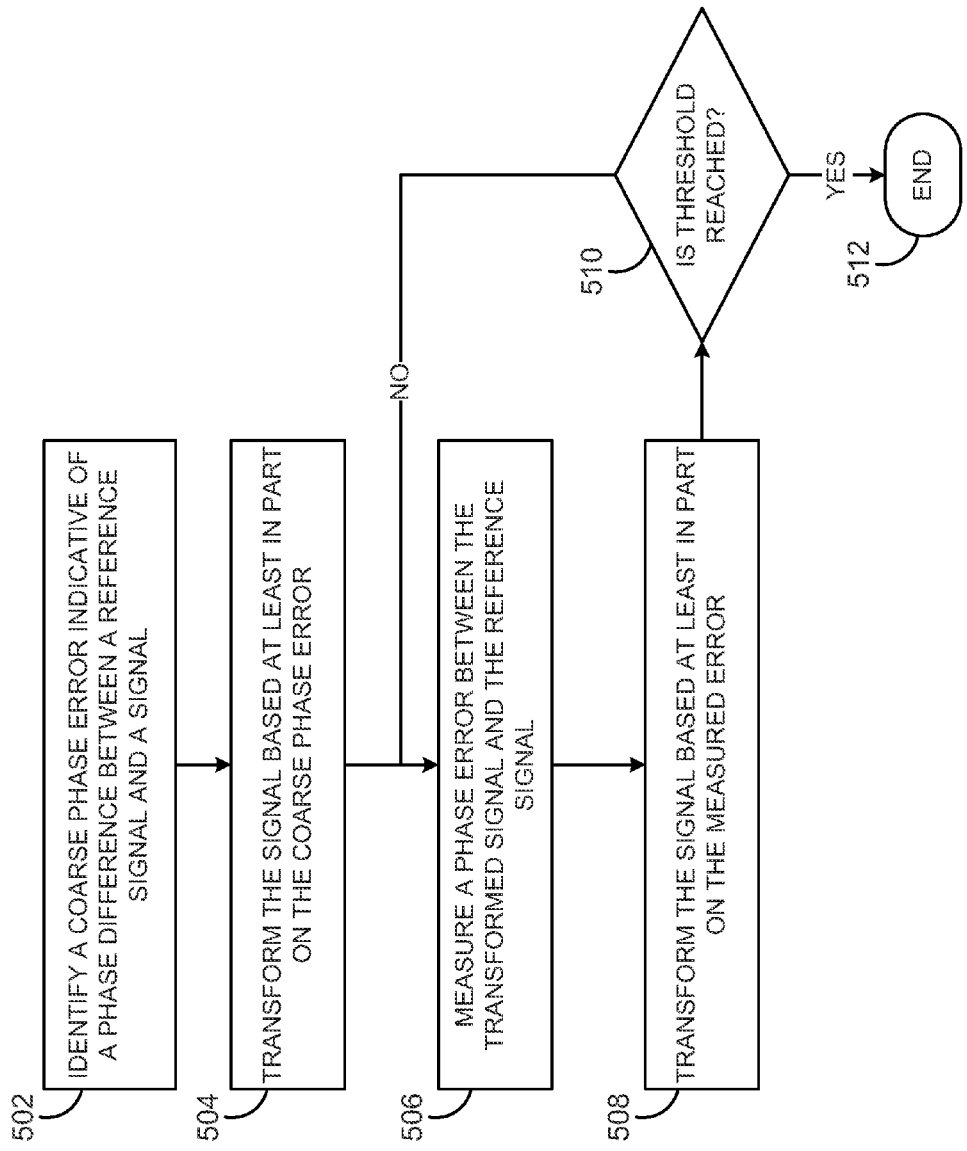
FIG. 5 shows a flow diagram of a method for aligning signals in a timing recovery system, in accordance with an embodiment of the disclosure.

FIG. 5 shows a flow diagram of a method 500 for aligning signals in a timing recovery system, in accordance with an embodiment of the disclosure. Method 500 includes identifying, with a coarse phase error identifier, a coarse phase error indicative of a phase offset between a reference signal and a signal (502). Method 500 further includes transforming the signal based at least in part on the coarse phase error (504). Method 500 further includes operating a closed loop circuit (506, 508, and 510). In particular, the closed loop circuit includes measuring a phase error between the transformed signal and the reference signal (506), transforming the signal based at least in part on the measured error (508), and determining whether a threshold has been reached (510).

At 502, a coarse phase error identifier identifies a coarse phase offset estimate indicative of a phase difference between a reference signal and a first signal. The coarse phase error identifier may be implemented with a system such as the open loop optimum phase locator 600, or any other suitable system for identifying a first phase offset estimate. In particular, the open loop optimum phase locator 600 iteratively selects a candidate phase offset in a set of candidate phase offset. For each selected candidate phase offset, the first signal is transformed based on the selected candidate phase offset. For example, transformation of the first signal may include applying the selected candidate phase offset to the first signal, thus horizontally shifting the first signal to obtain a transformed first signal. An error is measured between a difference between the reference signal and the transformed first signal, and the candidate phase offset corresponding to an error below a predetermined threshold may be identified as the coarse phase error. The coarse phase error is a coarse estimate of the phase offset between the reference signal and the first signal.

At 504, a transformer transforms the signal based at least in part on the coarse phase error identified at 502. In particular, the transformer may be plant 104, which applies transform instructions received from controller 102 to the signal. In an example, the transform instructions may include horizontally shifting the signal by an amount specified by the coarse phase error.

After identifying the coarse phase error at 502 and transforming the signal at 504, operation of a closed loop circuit is activated. In particular, the closed loop circuit is a phase-locked loop consisting of 506, 508, and 510. At 506, a phase error is measured between the transformed signal and the reference signal. As an example, referring now to FIG. 1, the phase of the transformed signal is subtracted from the phase of the reference signal, resulting in a phase error signal provided to controller 102.

At 508, the signal is transformed based at least in part on the measured error. In particular, the signal that is transformed at 508 may be the original signal or may be a transformed version of the original signal. As an example, the original signal may have been transformed for a first time at 504. The transformed signal may be provided as an input to sensor 106, such that the phase of the transformed signal is provided to adder 108 for measurement of the phase error at 506. The transform instructions provided to plant 104 from controller 102 may thus include complete instructions for transforming the original signal into a transformed signal, or instructions for transforming the first transformed signal into another transformed signal. As at 504, the transform instructions may include horizontally shifting the signal by an amount specified by the measured phase error.

At 510, it is determined whether a threshold is reached. In an example, the threshold corresponds to a phase error threshold, such that threshold is reached when the measured phase error at 506 is below some pre-determined phase error threshold value. In another example, the threshold corresponds to a time threshold, such that threshold is reached when the closed loop circuit has been active for a pre-determined amount of time.

At 512, it has been determined that threshold, as described in relation to 510, has been reached. In some embodiments, the process of aligning the reference signal to a signal in the timing recovery system is complete at 512. In some embodiments, the closed loop circuit of 506, 508, and 510 as described above corresponds to operation of system 200 in the first order, as described in relation to FIG. 2. In particular, when 512 is reached after the first order operation of system 200, the second order operation of system 200 may be activated. In this case, the second order closed loop circuit may again use 506, 508, and 510 to further align the signal to the reference signal.

In particular, the thresholds used at 510 for the first ordered loop and the second ordered loop may be the same or different. As an example, the first ordered loop may use a pre-determined time threshold, while the second ordered loop may use a pre-determined phase error threshold, or vice versa. As another example, if both the first ordered loop and the second ordered loop used pre-determined phase error thresholds, the threshold for the second ordered loop would be less than the threshold for the first ordered loop. This is because the second ordered loop further refines the alignment between the signals, such that the phase error resulting from the second ordered loop is smaller than the error resulting from the first ordered loop. As another example, if both the first ordered loop and the second ordered loop used pre-determined time thresholds, the time thresholds may be the same or different. First order and second order phase-locked loops are described herein, but in general, any order of closed loop circuits may be used.

System 200 is a part of a closed loop circuit (i.e., as shown in FIG. 1), such that during operation in a closed loop mode (i.e., first order or second order modes), additional iterations within the closed loop may be performed. With each iteration, 506, 508, and 510 are repeated to provide an updated adjusted phase error, which may be obtained at the output of system 200. After a number of iterations, the updated measured phase error should converge to an optimal phase offset value that results in a nearly zero error between the transformed signal and the reference signal.

Figure 6:
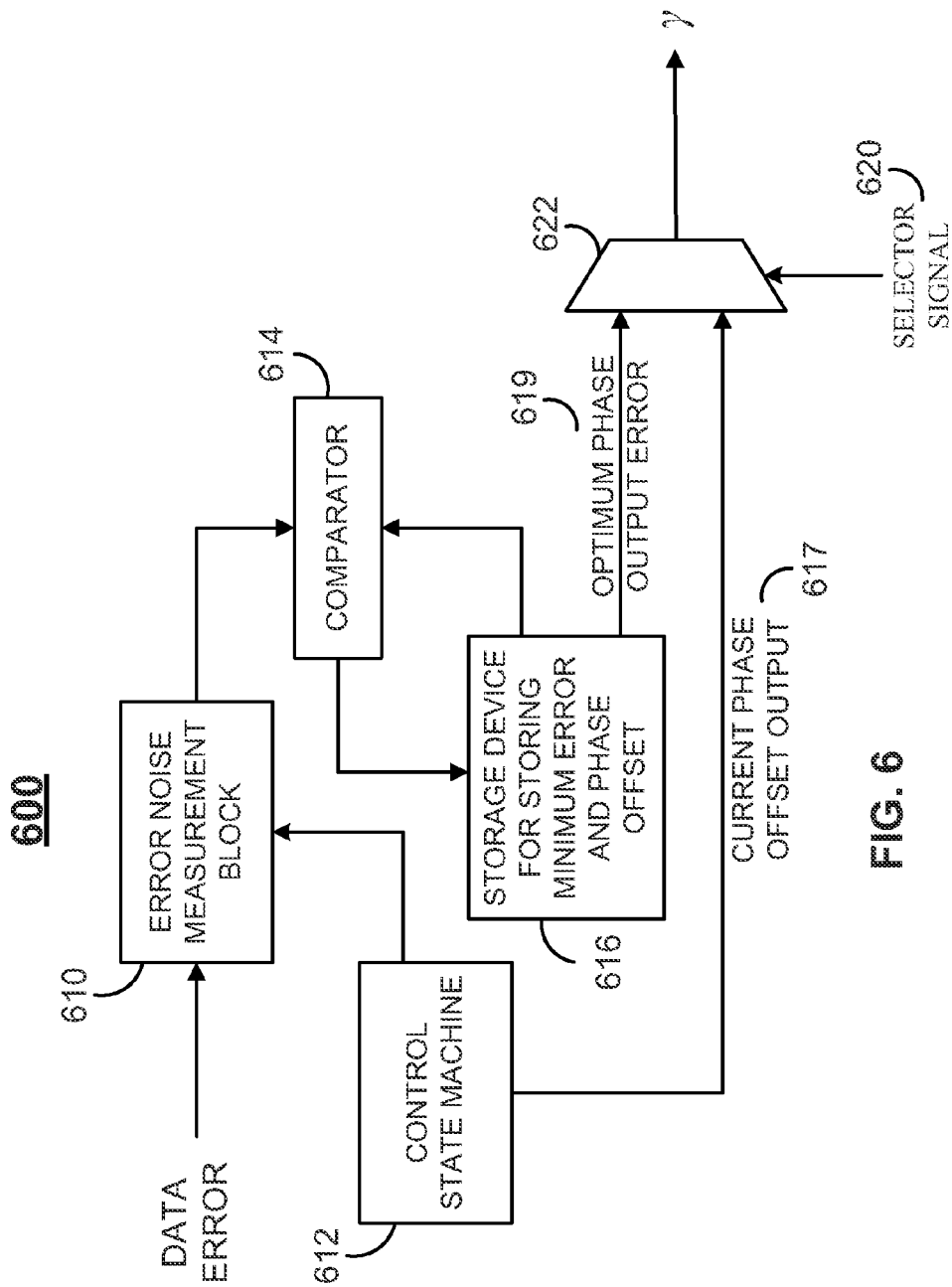
FIG. 6 shows an illustrative block diagram of an optimum phase identifier, in accordance with an embodiment of the disclosure.

FIG. 6 shows an illustrative block diagram of an open loop optimum phase locator 600, in accordance with an embodiment of the disclosure. Optimum phase locator 600 may be used to iteratively measure an error between a reference clock signal and a transformed clock signal to determine a transformation that results in a transformed first clock signal that matches the reference clock signal. The iterative measurements may be performed for a number phase offsets used to transform the first clock signal.

Optimum phase locator 600 includes a control state machine 612, an error noise measurement block 610, a comparator 614, and a storage device 616 for storing a minimum error and phase offset.

Control state machine 612 may keep track of a set of candidate phase offsets. System 600 may be required to measure an error corresponding to each phase offset in the set of phase offsets. Alternatively, system 600 may parse through the set of phase offsets, until a phase offset is identified that results in an error below a predetermined threshold. In either case, control state machine 612 tracks which phase offsets in the set of phase offsets have been considered, and sets a next phase offset in the set of phase offsets by providing a current phase offset output 617 to multiplexer 622.

In addition, control state machine 612 provides instructions to error noise measurement block 610 for how to measure the error. For example, control state machine 612 may set a parameter $\mu_f$ for controlling the gain and bandwidth of a low pass filter used during the error noise measurement, as is described in relation to FIGS. 7A and 7B. In addition, control state machine 612 may instruct error noise measurement block 610 to wait a period of time before analyzing the data error. The period of time may correspond to an amount of time for the phase offset to be applied to the first signal.

Figure 7A:
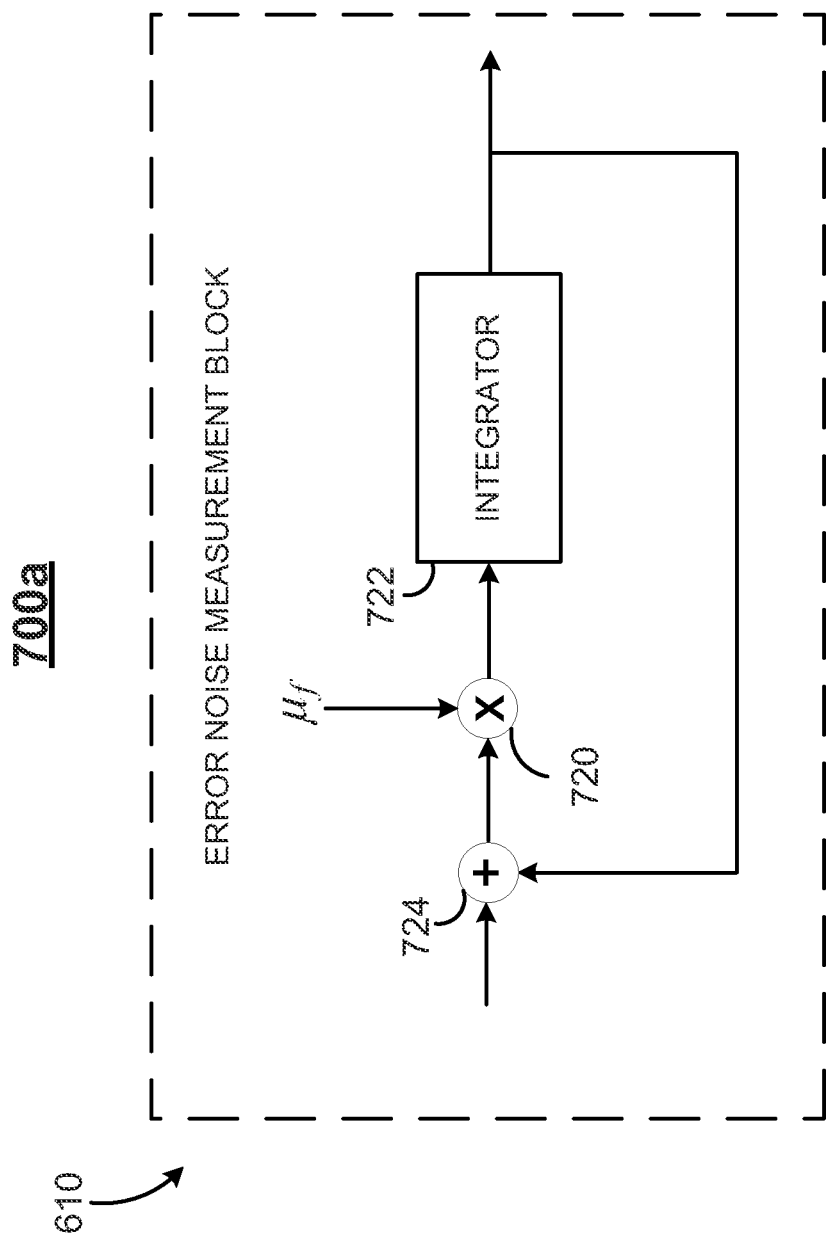
FIG. 7A shows an illustrative block diagram of an error noise measurement block, in accordance with an embodiment of the disclosure.

Error noise measurement block 610 measures an error between two signals. The output to the error noise measurement block 610 may be a data error signal, such as a phase difference between two signals. The error noise measurement block may include a first order low pass filter, as shown in FIG. 7A, to produce an output value representative of a difference between two signals. Error noise measurement block 610 and an exemplary method of how the error noise measurement is performed are described in more detail in relation to FIGS. 7A and 7B.

The output of error noise measurement block 610 is provided to comparator 614, which compares the said output to a stored minimum error at storage device 616. After performing the comparison, if the last measured error was smaller than the stored minimum error, comparator 614 updates storage device 616 with the last measured error and corresponding phase position.

When all phase offsets in the set of phase offsets have been considered, or when a phase offset is found that corresponds to an error below a predetermined threshold, the optimum phase has been identified. After identifying the optimum phase, selector signal 620 at multiplexer 622 selects optimum phase output error 619, which is provided as the coarse estimate for γ during operation of system 200 in the first or second order mode.

FIG. 7A shows an illustrative block diagram of an error noise measurement block 610, in accordance with an embodiment of the disclosure. Error noise measurement block 610 includes a multiplier 720, an adder 724, and a first order low pass filter 722. Low pass filter 722 may be implemented as an analog infinite impulse response filter (as in FIG. 3A), as a digital infinite impulse response (as in FIG. 3B), as a finite impulse response, or using any other suitable filter known in the art. Parameter $\mu_f$ controls the gain and bandwidth of low pass filter 722 and is set to different values, as is described in relation to FIG. 7B. As described in relation to FIG. 6, the values for parameter $\mu_f$ may be determined by control state machine 612.

A high value for $\mu_f$ corresponds to a large gain and large filter bandwidth. In this case, the filter impulse response has a fast decay, meaning that the measurement is fast but noisy. In contrast, a low value for $\mu_f$ corresponds to a small gain and small filter bandwidth. In this case, the filter impulse response has a slower decay, meaning that the measurement is slower but less noisy. Appropriate values should be chosen for $\mu_f$ while considering this tradeoff between measurement speed and noise.

FIG. 7B shows a flow diagram of a method 700b for measuring an error noise, in accordance with an embodiment of the disclosure. Method 700b includes a sequence of setting different values for $\mu_f$ for fixed amounts of time. In particular, method 700b includes setting a first value $\mu_{f1}$ for a first time interval (730), followed by a second value $\mu_{f2}$ for a second time interval (732), and a third value $\mu_{f3}$ for a third time interval (734). After the sequence of different values for $\mu_f$ is complete, the error measurement is complete (736).

In some embodiments, the first value $\mu_{f1}$ is greater than the second value $\mu_{f2}$, which is greater than the third value $\mu_{f3}$. By using an initially high value for $\mu_f$, error noise measurement block 610 performs some smoothing, while still allowing some noise in the system. Then the value for $\mu_f$ is stepped down to a value lower than the initial value. After the value for $\mu_f$ is lowered, the corresponding low pass filter has a smaller bandwidth and a smaller gain. When this occurs, additional smoothing is applied to the phase error signal, and less noise is allowed. Compared to using a constant value for $\mu_f$, using a series of steps to sequentially decrease the value for $\mu_f$ results in a more precise yet efficient error measurement.

Three intervals are shown for illustrative purposes only. However, in general, any number of intervals may be used to set μf to different values.

In some embodiments, an eye diagram monitor is used to determine when a particular phase offset is sufficiently precise. Eye diagrams are useful for determining an amount of signal distortion in a signal. In particular, an eye diagram for an imprecise phase offset will show a larger amount of signal distortion than for a more precise phase offset. The amount of signal distortion may be measured from the eye diagram in any number of ways, such as measuring a signal-to-noise ratio of the eye diagram, the eye amplitude, or the eye delay. The eye diagram monitor may be used to determine when an alignment between the signals is sufficiently precise to move on to the next mode. As an illustrative example, system 200 may remain in the optimal phase search mode until the eye diagram monitor determines that a low enough amount of signal distortion has been achieved. Upon this determination, system 200 may transition to the first order closed phase locked loop mode. In the first order mode, the eye diagram monitor may require an even lower amount of signal distortion before system 200 may transition to the second order mode.

Figure 8:
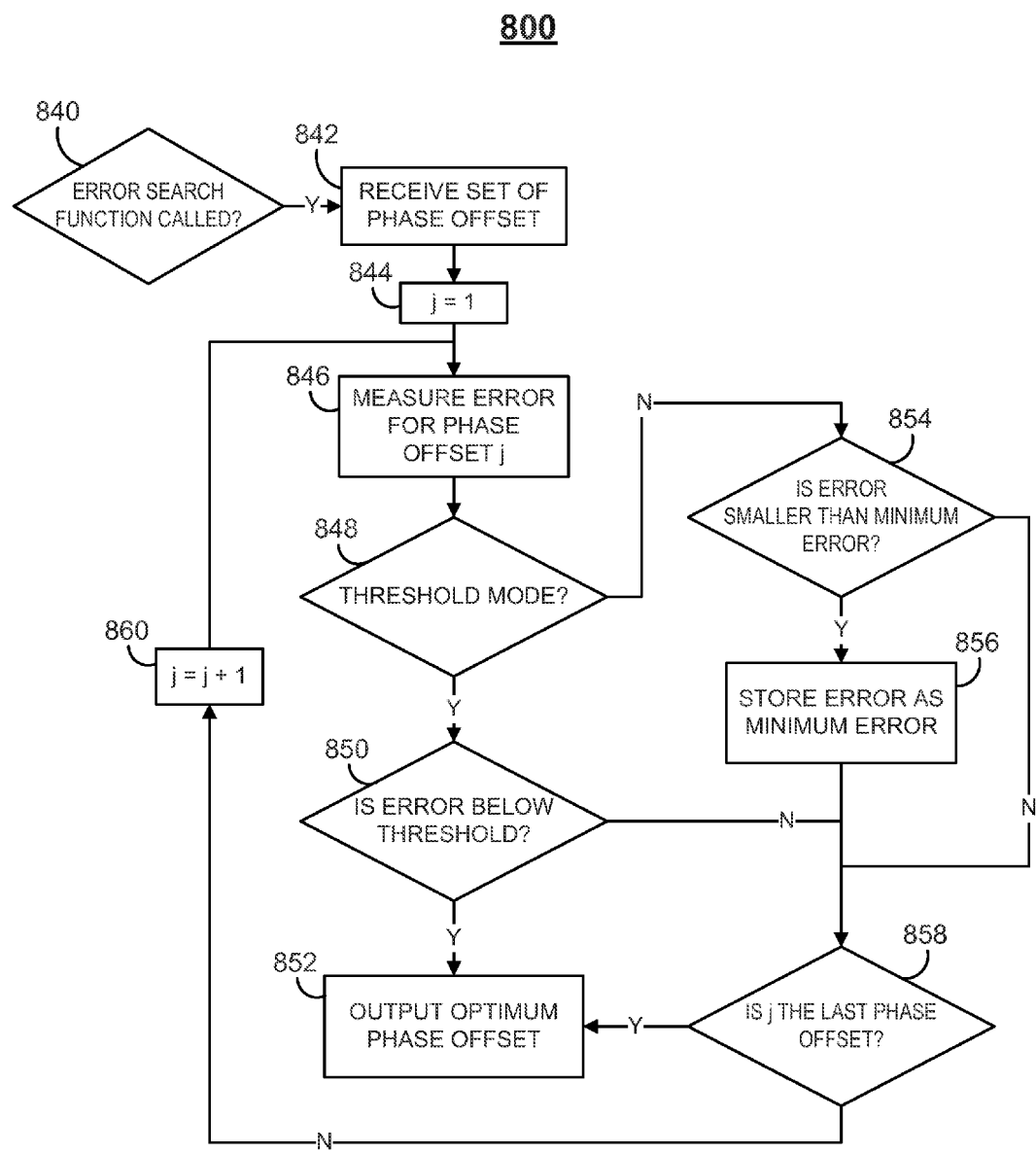
FIG. 8 shows a flow diagram of a method for identifying an optimum phase, in accordance with an embodiment of the disclosure.

FIG. 8 shows a flow diagram of a method 800 for identifying an optimum phase offset, in accordance with an embodiment of the disclosure. Method 800 may be executed by optimum phase locator 600 for parsing through a set of candidate phase offsets. In particular, method 800 includes the steps of determining that an error search function has been called (840), receiving a set of phase offsets (842), setting an iteration parameter j to 1 (844), and measuring the error for the $j^{th}$ phase offset (846). If the system is operating in a threshold mode (848), and if the error is below a threshold, the method outputs the $j^{th}$ phase offset as an optimum phase offset (i.e., the coarse estimate of the optimal phase offset) (852). If the system is not operating in a threshold mode, then a comparison between the $j^{th}$ error and a stored minimum error is performed (854). If the $j^{th}$ error is below the minimum error, the $j^{th}$ error is stored as the minimum error (856). The iteration parameter j is incremented (860) until each phase offset in the received set of phase offsets has been considered, and the optimal phase offset (i.e., the coarse estimate) is output (852).

At 840, optimum phase locator 600 determines that the error search function has been called.

At 842, optimum phase locator 600 receives a set of candidate phase offsets, or retrieves the set from a storage device. In some embodiments, the set of candidate phase offsets are uniformly spaced, over a range from 0 to 2π, for example. The resolution of the set of candidate phase offsets is dependent on how much time is allocated for completion of the optimum phase search and how much time each error measurement takes. A finer resolution may be used when there is a larger amount of time is allowed for the search, or if each error measurement is relatively fast. In contrast, a coarse resolution may be used if a small amount of time is allocated for the search, or if each error measurement is relatively slow. In another example, the system may use non-uniformly spaced phase offsets. In particular, the system may have some knowledge that the optimum phase offset is within some range (pi/2 to pi, for example). In this case, the set of candidate phase offsets may have finer spaced phase offsets within the range, and may have wider spaced phase offsets outside of the range.

At 844, an iteration parameter j is initialized to one. The iteration parameter j corresponds to a unique label for each phase offset in the set of phase offsets.

At 846, error noise measurement block 610 measures a corresponding error term for the current phase offset j in the set of phase offsets. In particular, error noise measurement block 610 may use the diagram in FIG. 7A and the flow diagram in FIG. 7B to perform the measurement. However, any suitable method of performing an error measurement may also be used.

At 848, optimum phase locator 600 determines whether the system is operating in a threshold mode. In an example, operation in threshold mode or not may be set by setting a value for a flag variable. In particular, determining whether the system is operating in threshold mode may include identifying a stored value for the flag variable.

If it is determined that the system is operating in threshold mode, at 850, optimum phase locator 600 determines whether the error for the current phase offset j is below a predetermined threshold. In particular, comparator 614 may be used to compute this comparison. If the current error is below the threshold, the error is saved as the coarse estimate for the optimal phase offset and is provided as an output at 852. Alternatively, if the error is not below the threshold, optimum phase locator 600 determines whether phase offset j is the last phase offset in the set at 858. If phase offset j is not the last phase offset, the iteration parameter j is incremented at 860, and the error for the next phase offset is measured at 846.

Alternatively, if it is determined that the system is not operating in threshold mode, optimum phase locator 600 may parse through each phase offset in the set. The phase offset resulting in the smallest error in the set may be labeled as the coarse estimate for the optimal phase offset. In particular, at 854, comparator 614 determines whether the current error (corresponding to phase offset j) is below a stored minimum error (stored in storage device 616, for example). If the current error is below the stored minimum error, the stored minimum error is updated as the current error, and optimum phase locator 600 determines whether phase offset j is the last phase offset in the set at 858. Otherwise, method 800 proceeds directly to 858 to determine whether phase offset j is the last phase offset in the set. The iteration parameter j is incremented until all phase offsets in the set have been considered, or until a phase offset has been found with a corresponding error below a predetermined threshold.

Figure 9:
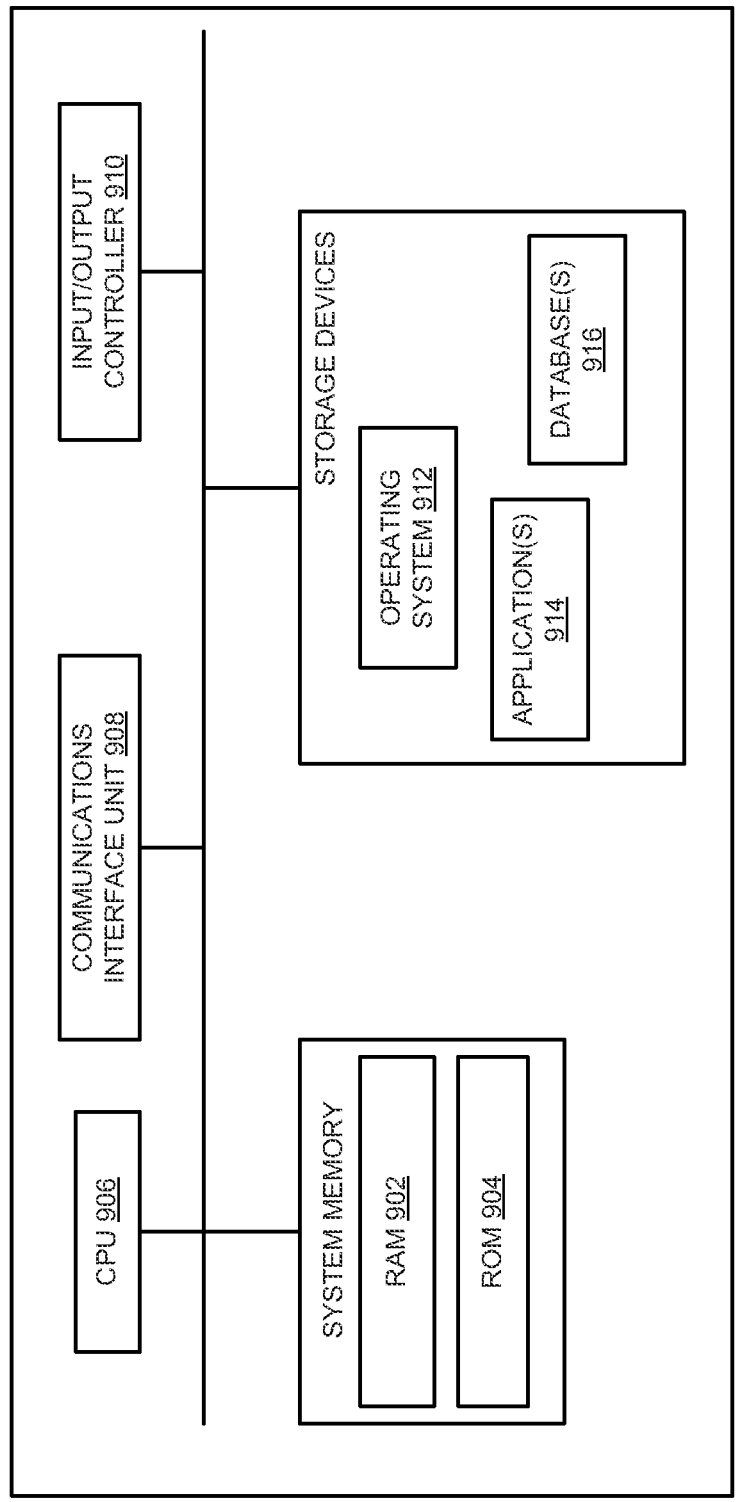
FIG. 9 is a block diagram of a computing device, such as any of the components of the system of FIG. 1, for performing any of the processes described herein, in accordance with an embodiment of the disclosure.

FIG. 9 is a block diagram of a computing device, such as any of the components of the system of FIG. 1, for performing any of the processes described herein, in accordance with an embodiment of the disclosure. Each of the components of these systems may be implemented on one or more computing devices 900. In certain aspects, a plurality of the components of these systems may be included within one computing device 900. In certain implementations, a component and a storage device may be implemented across several computing devices 900.

The computing device 900 comprises at least one communications interface unit, an input/output controller 910, system memory, and one or more data storage devices. The system memory includes at least one random access memory (RAM 902) and at least one read-only memory (ROM 904). All of these elements are in communication with a central processing unit (CPU 906) to facilitate the operation of the computing device 900. The computing device 900 may be configured in many different ways. For example, the computing device 900 may be a conventional standalone computer or alternatively, the functions of computing device 900 may be distributed across multiple computer systems and architectures. In FIG. 9, the computing device 900 is linked, via network or local network, to other servers or systems.

The computing device 900 may be configured in a distributed architecture, wherein databases and processors are housed in separate units or locations. Some units perform primary processing functions and contain at a minimum a general controller or a processor and a system memory. In distributed architecture implementations, each of these units may be attached via the communications interface unit 908 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 906 comprises a processor, such as one or more conventional microprocessors and one or more supplementary co-processors such as math co-processors for offloading workload from the CPU 906. The CPU 906 is in communication with the communications interface unit 908 and the input/output controller 910, through which the CPU 906 communicates with other devices such as other servers, user terminals, or devices. The communications interface unit 908 and the input/output controller 910 may include multiple communication channels for simultaneous communication with, for example, other processors, servers or client terminals.

The CPU 906 is also in communication with the data storage device. The data storage device may comprise an appropriate combination of magnetic, optical or semiconductor memory, and may include, for example, RAM 902, ROM 904, flash drive, an optical disc such as a compact disc or a hard disk or drive. The CPU 906 and the data storage device each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 906 may be connected to the data storage device via the communications interface unit 908. The CPU 906 may be configured to perform one or more particular processing functions.

The data storage device may store, for example, (i) an operating system 912 for the computing device 900; (ii) one or more applications 914 (e.g., computer program code or a computer program product) adapted to direct the CPU 906 in accordance with the systems and methods described here, and particularly in accordance with the processes described in detail with regard to the CPU 906; or (iii) database(s) 916 adapted to store information that may be utilized to store information required by the program.

The operating system 912 and applications 914 may be stored, for example, in a compressed, an uncompiled and an encrypted format, and may include computer program code.

The instructions of the program may be read into a main memory of the processor from a computer-readable medium other than the data storage device, such as from the ROM 904 or from the RAM 902. While execution of sequences of instructions in the program causes the CPU 906 to perform the process steps described herein, hard-wired circuitry may be used in place of, or in combination with, software instructions for implementation of the processes of the present disclosure. Thus, the systems and methods described are not limited to any specific combination of hardware and software.

Suitable computer program code may be provided for performing one or more functions in relation to identifying an optimum phase offset between two signals as described herein. The program also may include program elements such as an operating system 912, a database management system and "device drivers" that allow the processor to interface with computer peripheral devices (e.g., a video display, a keyboard, a computer mouse, etc.) via the input/output controller 910.

The term "computer-readable medium" as used herein refers to any non-transitory medium that provides or participates in providing instructions to the processor of the computing device 900 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer can read.

Various forms of computer readable media may be involved in carrying one or more sequences of one or more instructions to the CPU 906 (or any other processor of a device described herein) for execution. For example, the instructions may initially be borne on a magnetic disk of a remote computer (not shown). The remote computer can load the instructions into its dynamic memory and send the instructions over an Ethernet connection, cable line, or even telephone line using a modem. A communications device local to a computing device 900 (e.g., a server) can receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for aligning signals in a timing recovery system, comprising:
    identifying a coarse phase error indicative of a phase offset between a reference signal and a signal by iteratively selecting a candidate phase offset in a plurality of candidate phase offsets, wherein the coarse phase error is identified as the candidate phase offset corresponding to an error below a predetermined threshold;
    transforming the signal based at least in part on the coarse phase error; and
    initiating operation of a phase-locked loop based at least in part on the coarse phase error.

2. The method of claim 1, wherein operation of a phase-locked loop comprises:
    continuously measuring a phase error between the transformed signal and the reference signal; and
    continuously transforming the signal based at least in part on the measured error.

3. The method of claim 2, wherein continuously transforming the signal comprises shifting the signal by an amount corresponding the continuously measured phase error.

4. The method of claim 1, wherein identifying the coarse phase error comprises:
    for each selected candidate phase offset, transforming the signal based at least in part on the selected candidate phase offset; and
    measuring an error between the transformed signal and the reference signal.

5. The method of claim 1, wherein the error is measured by obtaining a phase difference signal between the transformed signal and the reference signal.

6. The method of claim 1, wherein the error is measured by applying a low pass filter to a phase difference signal between the transformed signal and the reference signal, wherein a gain parameter of the low pass filter is initially set to a first value, followed by a second value less than the first value.

7. The method of claim 1, wherein transforming the signal comprises shifting the signal by an amount corresponding to the coarse phase error.

8. The method of claim 1, wherein operating the phase-locked loop comprises:
    activating a first-order path comprising an integrator;
    determining first-order operation is complete when the continuously measured phase error is less than a first pre-determined threshold.

9. The method of claim 8, wherein operating the phase-locked loop further comprises:
    when determining that first-order operation is complete, activating a second-order path comprising two integrators;
    determining second-order operation is complete when the continuously measured phase error is less than a second pre-determined threshold, wherein the second pre-determined threshold is less than the first pre-determined threshold.

10. The method of claim 1, wherein operating the phase-locked loop comprises:
    activating a first-order path comprising an integrator;
    determining first-order operation is complete when a pre-determined time threshold is reached.

11. The method of claim 1, wherein initiating operation of a phase-locked loop comprises activating a first order path comprising an integrator, the method further comprising activating a second order path comprising two integrators.

12. A timing recovery apparatus for aligning signals, comprising:

an identifier configured to identify a coarse phase error indicative of a phase offset between a reference signal and a signal by iteratively selecting a candidate phase offset in a plurality of candidate phase offsets, wherein the coarse phase error is identified as the candidate phase offset corresponding to an error below a predetermined threshold;

a transformer configured to transform the signal based at least in part on the coarse phase error and a phase-locked loop for aligning a transformed version of the signal to the reference signal.

13. The timing recovery apparatus of claim 12, wherein the phase-locked loop is configured to:

continuously measure a phase error between a transformed signal and the reference signal; and continuously transform the signal based at least in part on the measured error.

14. The timing recovery apparatus of claim 13, wherein the phase-locked loop transforms the signal by shifting the signal by an amount corresponding to the continuously measured phase error.

15. The timing recovery apparatus of claim 12, wherein the identifier identifies a coarse phase error by:

for each selected candidate phase offset, transforming the signal based at least in part on the selected candidate phase offset; and measuring an error between the transformed signal and the reference signal.

16. The timing recovery apparatus of claim 12, wherein the identifier measures the error by obtaining a phase difference signal between the transformed signal and the reference signal.

17. The timing recovery apparatus of claim 12, wherein the identifier is configured to apply a low pass filter to a phase difference signal between the transformed signal and the reference signal, wherein a gain parameter of the low pass filter is initially set to a first value, followed by a second value less than the first value.

18. The timing recovery apparatus of claim 12, wherein the transformer transforms the signal by an amount corresponding to the coarse phase error.

19. The timing recovery apparatus of claim 12, wherein:

the phase-locked loop comprises a first-order path comprising an integrator; and first-order operation of the phase-locked loop is complete when the continuously measured phase error is less than a first pre-determined threshold.

20. The timing recovery apparatus of claim 19, wherein:

the phase-locked loop further comprises a second-order path comprising two integrators; and second-order operation of the phase-locked loop is complete when the continuously measured phase error is less than a second pre-determined threshold, wherein the second pre-determined threshold is less than the first pre-determined threshold.

21. The timing recovery apparatus of claim 12, wherein:

the phase-locked loop comprises a first-order path comprising an integrator; and first-order operation of the phase-locked loop is complete when a pre-determined time threshold is reached.

22. The timing recovery apparatus of claim 12, wherein the phase-locked loop includes a first order path comprising an integrator and a second order path comprising two integrators.

* * * * *